(12) United States Patent
Freer et al.

(10) Patent No.: US 8,716,210 B2
(45) Date of Patent: *May 6, 2014

(54) MATERIAL FOR CLEANING A SUBSTRATE (75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 720 days.

This patent is subject to a terminal disclaimer.

(21) Appl. No.: 12/948,613

(22) Filed: Nov. 17, 2010

(65) Prior Publication Data

US 2011/0065621 A1 Mar. 17, 2011

Related U.S. Application Data

(62) Division of application No. 11/532,491, filed on Sep. 15, 2006, now Pat. No. 7,862,662.

(60) Provisional application No. 60/755,377, filed on Dec. 30, 2005.

(51) Int. Cl.
*H01L 21/02* (2006.01)
*C11D 11/00* (2006.01)
*C11D 17/00* (2006.01)

(52) U.S. Cl.
CPC ..... *H01L 21/02052* (2013.01); *H01L 21/02057* (2013.01); *C11D 11/0047* (2013.01); *C11D 17/0013* (2013.01); *C11D 17/0017* (2013.01)
USPC .......................................... 510/175; 510/176

(58) Field of Classification Search
CPC ..................... H01L 21/02052; H01L 21/02057
USPC .................................................. 510/175, 176
See application file for complete search history.

(56) References Cited

U.S. PATENT DOCUMENTS 5,357,991 A * 10/1994 Bergman et al. ........... 134/102.1
5,792,218 A * 8/1998 Alvarez et al. .................... 8/111

(Continued)

FOREIGN PATENT DOCUMENTS

| JP | 07-161673 | 6/1995 | ............ H01L 21/304 |
| JP | 2000-040681 | 2/2000 | ............ H01L 21/304 |
| WO | WO 2005/006424 | 1/2005 | ............ H01L 21/306 |

*Primary Examiner* — Gregory Webb
(74) *Attorney, Agent, or Firm* — Martine Penilla Group, LLP (57) ABSTRACT

Material for cleaning using a tri-state body are disclosed. A substrate having a particle deposited thereon is provided. A tri-state body that has a solid portion, liquid portion, and a gas portion is generated. A force is applied over the tri-state body to promulgate an interaction between the solid portion and the particle. The tri-state body is removed along with the particle from the surface of the substrate. The interaction between the solid portion and the particle causes the particle to be removed along with the tri-state body.

18 Claims, 5 Drawing Sheets

(56) References Cited

U.S. PATENT DOCUMENTS

| | | | |
|---|---|---|---|
| 6,551,409 B1 * | 4/2003 | DeGendt et al. | 134/2 |
| 6,596,093 B2 * | 7/2003 | DeYoung et al. | 134/36 |
| 6,764,552 B1 * | 7/2004 | Joyce et al. | 134/3 |
| 7,451,941 B2 * | 11/2008 | Jackson | 239/423 |
| 7,696,141 B2 * | 4/2010 | Freer et al. | 510/175 |
| 7,737,097 B2 * | 6/2010 | Freer et al. | 510/175 |
| 7,862,662 B2 * | 1/2011 | Freer et al. | 134/34 |
| 8,242,067 B2 * | 8/2012 | Korolik et al. | 510/175 |
| 2005/0133060 A1 * | 6/2005 | Larios et al. | 134/1.3 |
| 2005/0183744 A1 * | 8/2005 | Staub et al. | 134/22.1 |
| 2009/0308410 A1 * | 12/2009 | Freer et al. | 134/6 |

* cited by examiner

MATERIAL FOR CLEANING A SUBSTRATE

CLAIM OF PRIORITY

This application is a divisional of and claims the priority from U.S. patent application Ser. No. 11/532,491 filed on Sep. 15, 2006 now U.S. Pat. No.7,862,662 and entitled "Methods and Material for Cleaning a Substrate", which claims priority under 35 U.S.C. §119(e) to U.S. Provisional Application No. 60/755,377, filed Dec. 30, 2005. The disclosure of each of the above-identified applications is incorporated herein by reference in their entirety.

CROSS REFERENCE TO RELATED APPLICATIONS

This application is related to U.S. patent application Ser. No. 10/816,337, filed on Mar. 31, 2004, and entitled "Apparatuses and Methods for Cleaning a Substrate," U.S. patent application Ser. No. 11/153,957, filed on Jun. 15, 2005, and entitled "Method and Apparatus for Cleaning a Substrate Using Non-Newtonian Fluids," U.S. patent application Ser. No. 11/154,129, filed on Jun. 15, 2005, and entitled "Method and Apparatus for Transporting a Substrate Using Non-Newtonian Fluid," U.S. patent application Ser. No. 11/174,080, filed on Jun. 30, 2005, and entitled "Method for Removing Material from Semiconductor Wafer and Apparatus for Performing the Same," U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," U.S. patent application Ser. No. 11/336,215, filed on Jan. 20, 2006, entitled "Method and Apparatus for removing contamination from a substrate," U.S. patent application Ser. No. 11/346,894, filed on Feb. 3, 2006, entitled "Method for removing contamination from a substrate and for making a cleaning solution," and U.S. patent application Ser. No. 11/347,154, filed on Feb. 3, 2006, entitled "Cleaning compound and method and system for using the cleaning compound." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

In view of the forgoing, there is a need for a more effective and less abrasive cleaning material and method for cleaning wafer surfaces.

SUMMARY

Broadly speaking, the present invention fills these needs by providing improved methods and materials for cleaning wafer surfaces. It should be appreciated that the present invention can be implemented in numerous ways, including as an apparatus, a method and a system. Several inventive embodiments of the present invention are described below.

In one embodiment, a cleaning material for preparing a substrate is disclosed. The cleaning material has a liquid component, a solid component, and a gas component. The solid component is defined a plurality of solids that are dispersed within the liquid component. The gas component is intermixed with the liquid component and the solid component to define the cleaning material in a state that is applied to the substrate.

In another embodiment, a substrate cleaning solution is disclosed. The substrate cleaning solution has a number of hydrocarbon chains that form a solid that is dispersed and in suspension within a liquid. A gas component is intermixed with the liquid and the solid, such that the liquid component and the gas component define an encapsulating transport, with the gas component substantially filling each encapsulating transport.

In still another embodiment, a foam for cleaning a substrate is disclosed. The foam includes a number of tri-state bodies having a diameter smaller than a largest dimension of a particle on the substrate. The tri-state bodies include a solid portion defined by a surfactant distributed in a liquid portion. The surfactant defines hydrocarbon chains having a carboxyl group. A gas portion along with the liquid and solid portions defines the tri-state bodies.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods and materials for cleaning wafer surfaces. It will be obvious, however, to one skilled in the art, that the present invention may be practiced without some or all of these specific details. In other instances, well known process operations have not been described in detail in order not to unnecessarily obscure the present invention.

As used herein, a tri-state body cleaning material contains a plurality of tri-state bodies that include a gas phase, a liquid phase and a solid phase. In one embodiment, the gas phase and liquid phase provides an intermediary to bring the solid phase into close proximity with contaminant particles 102 on a substrate surface. For further explanation of the composition of the tri-state body cleaning material and its mechanisms see U.S. patent application Ser. No. 11/346,894, filed on Feb. 3, 2006, entitled "Method for removing contamination from a substrate and for making a cleaning solution," U.S. patent application Ser. No. 11/347,154, filed on Feb. 3, 2006, entitled "Cleaning compound and method and system for using the cleaning compound" and U.S. patent application Ser. No. 11/336,215, filed on Jan. 20, 2006, entitled "Method and Apparatus for removing contamination from a substrate." The solid phase interacts with the particles 102 during cleaning to effectuate their removal. A substrate, as an example used herein, denotes without limitation, semiconductor wafers, hard drive disks, optical discs, glass substrates, and flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled.

Figure 1:
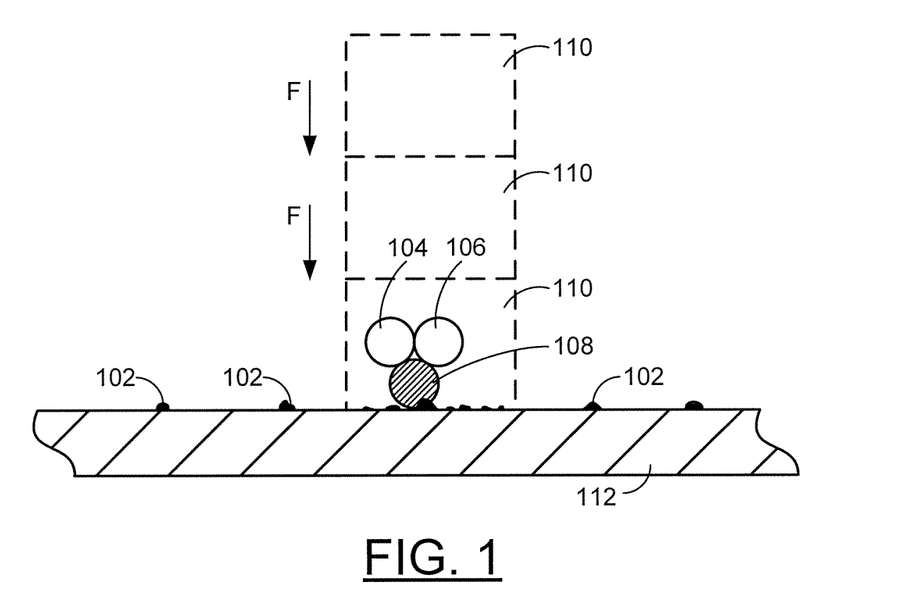
FIG. 1 is an illustration of a tri-state body interacting with a contaminant particle, in accordance with one embodiment of the present invention.

FIG. 1 is an illustration of a tri-state body interacting with a contaminant particle, in accordance with one embodiment of the present invention. In this depiction, the tri-state body 110 includes a gas portion 104, a liquid portion 106, and a solid portion 108. When a force is applied against the tri-state body 110 towards the surface of a substrate 112, the tri-state body 110 interacts with contaminant particles 102 situated on the surface of the substrate 112 as it moves closer to the particles 102. In one embodiment, the force (F), or a normal component of F, is applied by tri-state bodies 110 adjacent to the tri-state body 110 moving towards and interacting with the contaminant particles 102. In another embodiment, the F is applied by a fluid (e.g., gas or liquid) against the tri-state body 110 towards the substrate 112 surface. In still another embodiment, the F is applied by mechanical applicator such as a blade. It should be appreciated that the F can be applied using any apparatus so long as the substrate 112 cleaning properties of the tri-state body 110 is not substantially compromised by the apparatus during the application of F. In one embodiment, the fluid is a gas such as air, nitrogen ($N_2$), carbon dioxide ($CO_2$) and argon (Ar). In another embodiment, the fluid is a liquid that is immiscible with the liquid portion 106 of the tri-state body 110.

As depicted in FIG. 1, the force serves to move the solid portion 108 towards the substrate 112 and the contaminant particle 102 thereon. In one embodiment, the interaction between the solid portion 108 and the contaminant particle 102 occurs when the solid portion 108 is forced sufficiently close to the contaminant particle 102. Interaction between the solid portion 108 and the contaminant particle 102 can be established through one or more mechanisms including adhesion (e.g., chemical or physical), collision (i.e., transfer of momentum or kinetic energy), attractive forces (e.g., steric forces, electrostatic forces, etc.), physical and chemical bonding (e.g., covalent bonding, hydrogen bonding, etc.), among others. The interaction between the solid portion 108 and the contaminant particle 102 must be sufficient to overcome any adhesive forces between the contaminant particle 102 and the substrate 112, as well as any repulsive forces between the solid portion 108 and the contaminant particle 102. Therefore, when the solid portion 108 is moved away from the substrate 112, the contaminant particle 102 that interacted with the solid portion 108 is also removed or repulsed off the substrate 112.

In one embodiment, the gas portion 104 is defined to occupy 5% to 99.9% of the tri-state body 110 cleaning material by volume. The gas or gases defining the gas portion 104 can be either inert, e.g., nitrogen ($N_2$), argon (Ar), etc., or reactive, e.g., oxygen ($O_2$), ozone ($O_3$), hydrogen peroxide ($H_2O_2$), air, hydrogen ($H_2$), ammonia ($NH_3$), hydrogen fluoride (HF), hydrochloric acid (HCl), etc. In one embodiment, the gas portion 104 includes only a single type of gas, for example, nitrogen ($N_2$). In another embodiment, the gas portion 104 is a gas mixture that includes mixtures of various types of gases, such as: ozone ($O_3$), oxygen ($O_2$), carbon dioxide ($CO_2$), hydrochloric acid (HCl), hydrofluoric acid (HF), nitrogen (N2), and argon (Ar); ozone ($O_3$) and nitrogen ($N_2$); ozone ($O_3$) and argon (Ar); ozone ($O_3$), oxygen ($O_2$) and nitrogen ($N_2$); ozone ($O_3$), oxygen ($O_2$) and argon (Ar); ozone ($O_3$), oxygen ($O_2$), nitrogen ($N_2$), and argon (Ar); and oxygen ($O_2$), argon (Ar), and nitrogen ($N_2$). It should be appreciated that the gas portion 104 can include essentially any combination of gas types as long as the resulting gas mixture can be combined with a liquid portion 106 and a solid portion 108 to form a tri-state body 110 that can be utilized in substrate 112 cleaning or preparation operations.

Still with FIG. 1, it should be understood that depending on the particular embodiment, the solid portion 108 of the tri-state body 110 may possess physical properties representing essentially any sub-state, wherein the solid portion 108 is defined as a portion other than the liquid 106 or gas portions 104. For example, physical properties such as elasticity and plasticity can vary among different types of solid portions 108 within the tri-state body 110. Additionally, it should be understood that in various embodiments the solid portion 108 can be defined as crystalline solids or non-crystalline solids. Regardless of their particular physical properties, the solid portion 108 of the tri-state body 110 should be capable of avoiding adherence to the substrate 112 surface when positioned in either close proximity to or in contact with the substrate 112 surface or capable of being easily removed (e.g., hydrodynamic removal with rinse). Additionally, the physical properties of the solid portion 108 should not cause damage to the substrate 112 surface during the cleaning process. Furthermore, the solid portion 108 should be capable of establishing an interaction with the contaminant particle 102 present on the substrate 112 surface when positioned in either close proximity to or contact with the particle 102. In one embodiment, the solid portion 108 has foam inhibiting properties. In another embodiment, the solid portion 108 has foam enhancing properties. Depending on the application and the apparatus used to handle the tristate body, the foam enhancing or inhibiting properties can be adjusted, either in a stepped manner or in accordance with a recipe.

In one embodiment, the solid portion 108 avoids dissolution into the liquid portion 106 and gas portions 104 and has a surface functionality that enables dispersion throughout the liquid portion 106. In another embodiment, the solid portions 108 does not have surface functionality that enables dispersion throughout the liquid portion 106, therefore requiring chemical dispersants to be added to the liquid portion 106 to before the solid portions 108 can be dispersed through the liquid portion 106. In one embodiment, the solid portions 108 form through a precipitation reaction where a dissolved component in the liquid phase 106 reacts by the addition of one or more components to form an insoluble compound. In one embodiment, the solid portion 108 goes into suspension in the liquid portion 106 when a base is added to the liquid portion 106 (i.e., by altering the zeta potential). Depending on their specific chemical characteristics and their interaction with the surrounding liquid portion 106, the solid portion 108 may take one or more of several different forms.

For example, in various embodiments the solid portion 108 may form aggregates, colloids, gels, coalesced spheres, or essentially any other type of agglutination, coagulation, flocculation, agglomeration, or coalescence. It should be appreciated that the exemplary list of solid portion 108 forms identified above is not intended to represent an inclusive list, and alternates or extensions falling within the spirit of the disclosed embodiments are possible. It should further be understood that the solid portion 108 can be defined as essentially any solid material capable of functioning in the manner previously described with respect to their interaction with the substrate 112 and the contaminant particle 102.

Continuing with FIG. 1, some exemplary types of materials that can be used to make up the solid portion 108 includes aliphatic acids, carboxylic acids, paraffin, wax, polymers, polystyrene, polypeptides, and other visco-elastic materials. The solid portion 108 material should be present at a concentration that exceeds its solubility limit within the liquid portion 106. Also, it should be understood that the cleaning effectiveness associated with a particular solid portion 108 material may vary as a function of temperature, pH, and other environmental conditions.

The aliphatic acids represent essentially any acid defined by organic compounds in which carbon atoms form open chains. A fatty acid is an example of an aliphatic acid that can be used as the solid portion 108 within the tri-state body 110 cleaning material. Examples of fatty acids that may be used as the solid portion 108 include lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, cerotic acid, and mixtures thereof, among others. In one embodiment, the solid portion 108 can represent a mixture of fatty acids defined by various carbon chain lengths extending from C-1 to about C-26. Carboxylic acids are defined by essentially any organic acid that includes one or more carboxyl groups (COOH). When used as the solid portion 108 of a tri-state body 110, the carboxylic acids can include mixtures of various carbon chain lengths extending from C-1 through about C-100. Also, the carboxylic acids can include long-chain alcohols, ethers, and/or ketones, above the solubility limit in the liquid portion 106 of the tri-state body 110. In one embodiment, the fatty acid used in the solid portion 108 acts as a surfactant when coming into contact with the contaminant particle 102.

Still referring to FIG. 1, the liquid portion 106 can be either aqueous or non-aqueous. In one embodiment, an aqueous liquid portion 106 is defined by water (de-ionized or otherwise) alone. In another embodiment, an aqueous liquid portion 106 is defined by water in combination with other constituents that are in solution with the water. In still another embodiment, a non-aqueous liquid portion 106 is defined by a hydrocarbon, a fluorocarbon, a mineral oil, or an alcohol, among others. Irrespective of whether the liquid portion 106 is aqueous or non-aqueous, it should be understood that the liquid portion 106 can be modified to include ionic or non-ionic solvents and other chemical additives. For example, the chemical additives to the liquid portion 106 can include any combination of co-solvents, pH modifiers (e.g., acids and bases), chelating agents, polar solvents, surfactants, ammonia hydroxide, hydrogen peroxide, hydrofluoric acid, potassium hydroxide, sodium hydroxide, tetramethylammonium hydroxide, and rheology modifiers such as polymers, particulates, and polypeptides.

Figure 2:
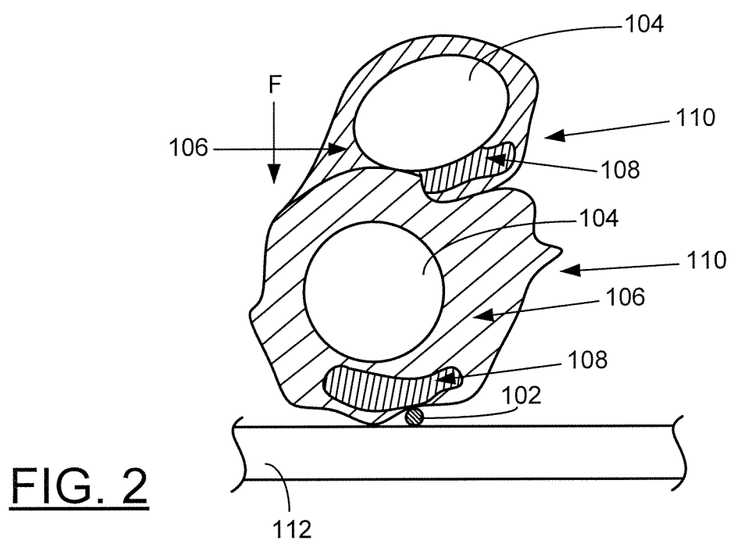
FIG. 2 is an illustration of a first tri-state body applying a force over a second tri-state body to create an interaction between the solid portion of the second tri-state body and the contaminant particle, in accordance with one embodiment of the present invention.

FIG. 2 is an illustration of a first tri-state body applying a force over a second tri-state body to create an interaction between the solid portion of the second tri-state body and the contaminant particle, in accordance with one embodiment of the present invention. In this depiction, a first tri-state body 110 including a gas portion 104, liquid portion 106 and a solid portion 108 is positioned above and over a second tri-state body 110 having the same. The first tri-state body 110 is shown applying a downward force against the second tri-state body 110 instigating an interaction between the solid portion 108 and the contaminant particle 102 on the substrate 112 surface. The downward force results when the gas portion 104, liquid portion 106 and solid portion 108 of the first tri-state body 110 contacts the same in the second tri-state body 110 causing a transfer in kinetic energy from the first tri-state body 110 to the second tri-state body 110. This transfer causes the second tri-state body 110 to move towards the contaminant particle 102 thus creating an interaction between the solid portion 108 of the second tri-state body 110 and the particle 102. As discussed above, the interaction may be established through one or more mechanisms including adhesion, collision, and attractive forces. Also, the term "downward" is noted herein, however, the force can be applied from any angle or direction. Consequently, an "upward" "sideways" or other directional force can be filed, and the directionality may be important when the force is applied to a substrate that may not be in the flat position, but may be at an angle, or vertically arranged or held.

In one embodiment, a pressure (i.e., force) exerted by a fluid causes the first tri-state body 110 to apply a force against the second tri-state body 110. It should be appreciated that the fluid can be either a liquid or a gas as long as the fluid can be utilized to apply a pressure against the tri-state bodies 110

(i.e., deformable droplets and bubbles) and does not appreciably dissolve into the gas portion 104, liquid portion 106, and solid portion 108 of the tri-state bodies 110. In another embodiment, tri-state bodies 110 adjacent to and in contact with the first tri-state body 110 applies a force against the first tri-state body 110 cascading into the second tri-state body 110 and applying a force against the second tri-state body 110.

Figure 3:
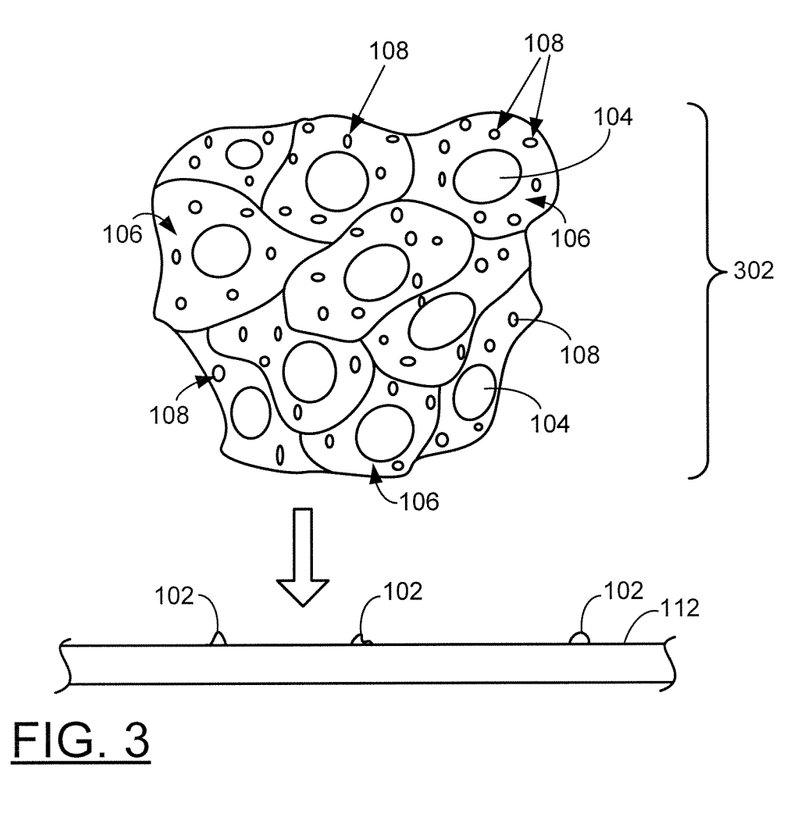
FIG. 3 is an illustration of a tri-state body cleaning material formed prior to being applied against the surface of a substrate, in accordance with one embodiment of the present invention.

FIG. 3 is an illustration of a tri-state body cleaning material formed prior to being applied against the surface of a substrate, in accordance with one embodiment of the present invention. As depicted herein, the tri-state body cleaning material 302 includes a plurality of tri-state bodies 110 each having a gas portion 104, liquid portion 106, and a solid portion 108. The plurality of tri-state bodies 110 aggregating together as a unified tri-state body cleaning material 302 due to chemical bonding (e.g., covalent bonding, hydrogen bonding, etc.) between the liquid portions 106 of each of the tri-state bodies 110. As such the physical boundaries of the various tri-state bodies 110 are in a constant state of flux. In one embodiment, the tri-state body cleaning material 302 is in the form of a foam. The foam being a material that is comprised of a dispersed phase that is a gas and a continuous phase that is a liquid.

In one embodiment, the apparatus includes a support configured to support the semiconductor wafer. A foam manifold is configured to introduce foam to the semiconductor wafer while the semiconductor wafer is supported by the support. A form provides pressure to the foam disposed on a surface of the semiconductor wafer to produce a jammed foam. An actuator effects relative movement between the form and the semiconductor wafer while the jammed foam is in contact with the surface of the semiconductor wafer to remove undesired particles from the surface of the semiconductor wafer.

The form may include a platen disposed on the foam. The platen may have an area at least that of the semiconductor wafer such that the pressure is provided to the foam over the entire surface of the semiconductor wafer. Alternatively, the form may include a pressure structure that is smaller than the entire surface of the semiconductor wafer such that the pressure is provided to the foam in a local area over the surface of the semiconductor wafer. Such a pressure structure may be a mandrel or a wheel.

The foam may include bubbles having a diameter of at most a largest linear dimension of the particles on the surface of the semiconductor wafer. Alternatively, the foam may have a density (the number of bubbles per unit volume) sufficient to permit the bubbles to be rearranged into a first energy state when pressure is applied rather than rupture, in which the first energy state is lower than a second energy state of the foam existing before the pressure was applied. The apparatus may be configured to provide an additional layer of jammed foam between the semiconductor wafer and the support.

The foam may include a liquid and bubbles, the liquid containing a chemical providing a chemical treatment to the semiconductor wafer. The liquid may be configured to etch the semiconductor wafer or a layer disposed on the semiconductor wafer, the liquid may contain cleaning agents suitable to clean the semiconductor wafer, or the liquid may include at least one of HCl, ammonium hydroxide, SC1 (standard clean 1-an ammonium hydroxide-hydrogen peroxide-water mixture typically 0.25:1:5), SC2 (standard clean 2-a hydrochloric acid-hydrogen peroxide-water mixture typically 1:1:5), and HF. The foam may include bubbles that contain a reactive gas.

The process of creating a foam is relatively simple: a suitable liquid is transformed into foam by mixing a gas with the liquid. A suitable liquid is one in which the desired foam can be produced and provides the desired chemical treatment to the semiconductor wafer as the liquid phase of the foam is substantially identical to the original liquid used to create the foam. Foam can be produced by mixing of non-soluble gases, like air, or by decompression of solutions containing soluble gases into the liquid. In either case, energy is added to the mixture to form the foam.

Foams are in a metastable state when generated. This means that immediately following production, the foam starts to decay, thereby essentially reproducing the gas and the original liquid. This decay process is called draining. The rate of draining, called the drain time, varies depending on the foam. For example, the drain time for foams having the consistency of shaving cream may be hours while that of foams having the consistency of shampoo may be minutes or less. The drain time can be controlled by altering the type of liquid composing the foam and the density of the foam, for example, as desired to aid in the treatment of the semiconductor wafer.

The foam may be created or stored in a pressurized environment. Once released from this pressurized environment, e.g. from a storage facility through a manifold, the foam expands in volume. When applied through the manifold to the semiconductor wafer, such a foam reduces the volume of reactants and solvents in the liquid that contact the semiconductor wafer. However, the foam also reduces the exposure of the semiconductor wafer to contaminants in the conduits through which the foam has been transferred to the semiconductor wafer as less material passes through the conduits. Foams also exhibit thixotropic flow properties, and thus flow best under shear. Some foams, such as those having properties similar to shaving cream, spread easily under high shear but remain substantially stationary when the shear force is removed. Under low shear foam generally acts like solid, having elastic properties. In addition, as the walls of the bubbles in the foam provide surface tension, the use of liquids with low surface tension and low viscosity permit penetration of typical structures fabricated on the semiconductor wafers, such as vias and trenches.

Both the types of liquids and gases that form the foam, as well as the environmental factors present during foam generation, such as temperature and pressure, may be adjusted to control the foam composition. For example, the use of high purity liquids, e.g. water or chemicals used for other types of chemical treatments (for example etching), increases the effectiveness of the foaming as few contaminants are present to interfere with foaming. For example, addition of an agent that reduces surface tension such as soaps, detergents, isopropyl alcohol, nitrous oxide, isobutane, or carbon dioxide may also be added to the liquid when forming the foam. Additionally, as foaming is better at warmer temperatures due to the decrease in surface tension, the temperature of the liquid used can be adjusted to optimize foaming behavior. In one embodiment, the drain time of a suitable foam may be less than one or two minutes. Accordingly, it is possible to use relatively fast-draining foams. In fact the use of somewhat fast-draining foams may be desirable in that few, if any, additional such foams avoid the need for additional measure to remove it.

In one embodiment, the tri-state body cleaning material 302 is generated using an applicator prior to application to the substrate 112. The applicator taking the constituents that make-up the gas portion 104, liquid portion 106, and solid portion 108 of the tri-state bodies 110 and processing (by providing the appropriate agitation and/aeration) them to form the tri-state body cleaning material 302. Examples of applicator types that can be used to form the tri-state body cleaning material 302 include proximity heads, manifolds, spargers, mixers, etc. It should be understood that any applicator type can be used to form the tri-state body cleaning material 302 as long as the applicator can be configured to provide the necessary agitation and/or aeration to generate the tri-state body cleaning material 302. In another embodiment, the tri-state body cleaning material 302 is generated in a reservoir prior to dispensing via an applicator to the substrate 112 surface. The reservoir being configured to apply sufficient agitation and/or aeration to the starting materials of the tri-state bodies 110 to generate the tri-state body cleaning material 302.

Figure 4:
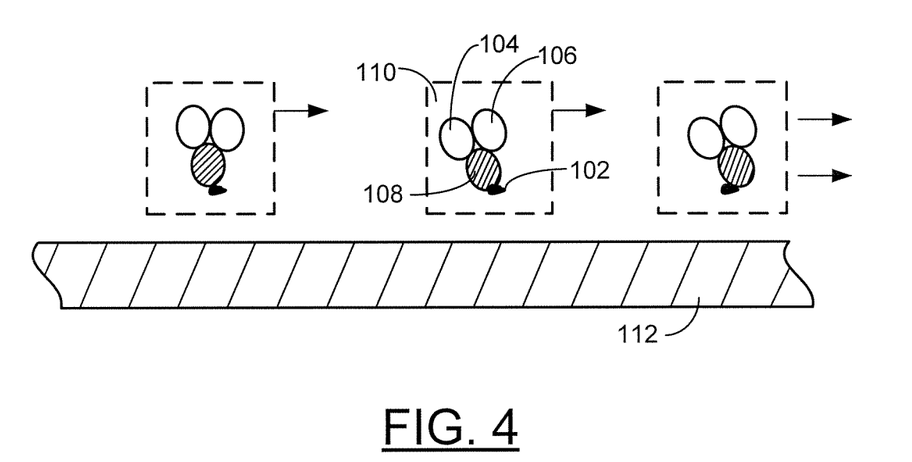
FIG. 4 is an illustration of a tri-state body removing a contaminant particle from the surface of a substrate, in accordance with one embodiment of the present invention.

FIG. 4 is an illustration of a tri-state body removing a contaminant particle from the surface of a substrate, in accordance with one embodiment of the present invention. In this depiction, the tri-state body 110 as shown includes a gas portion 104, a liquid portion 106 and a solid portion 108. The interaction between the solid portion 108 of the tri-state body 110 and the contaminant particle 102 results in the particle 102 being removed from the surface of the substrate 112 as the tri-state body 110 is removed from the surface of the substrate 112.

In one embodiment, the tri-state body 110 is removed by rinsing the surface of the substrate 112 with a liquid. The liquid directly contacts the tri-state body 110 to transport and remove the tri-state body 110 from the substrate 112 surface. In another embodiment, the tri-state body 110 is removed due to the attractive forces between the tri-state body 110 and adjacent tri-state bodies 110 that are themselves in the process of being removed form the substrate 112 surface. In still another embodiment, the tri-state body 110 is removed using an apparatus configured to mechanically sweep the tri-state body 110 off the surface of the substrate 112. It should be understood that the tri-state body 110 can be removed from the substrate 112 surface using any method as long the substrate 112 is not damaged as a result of the removal.

Figure 5:
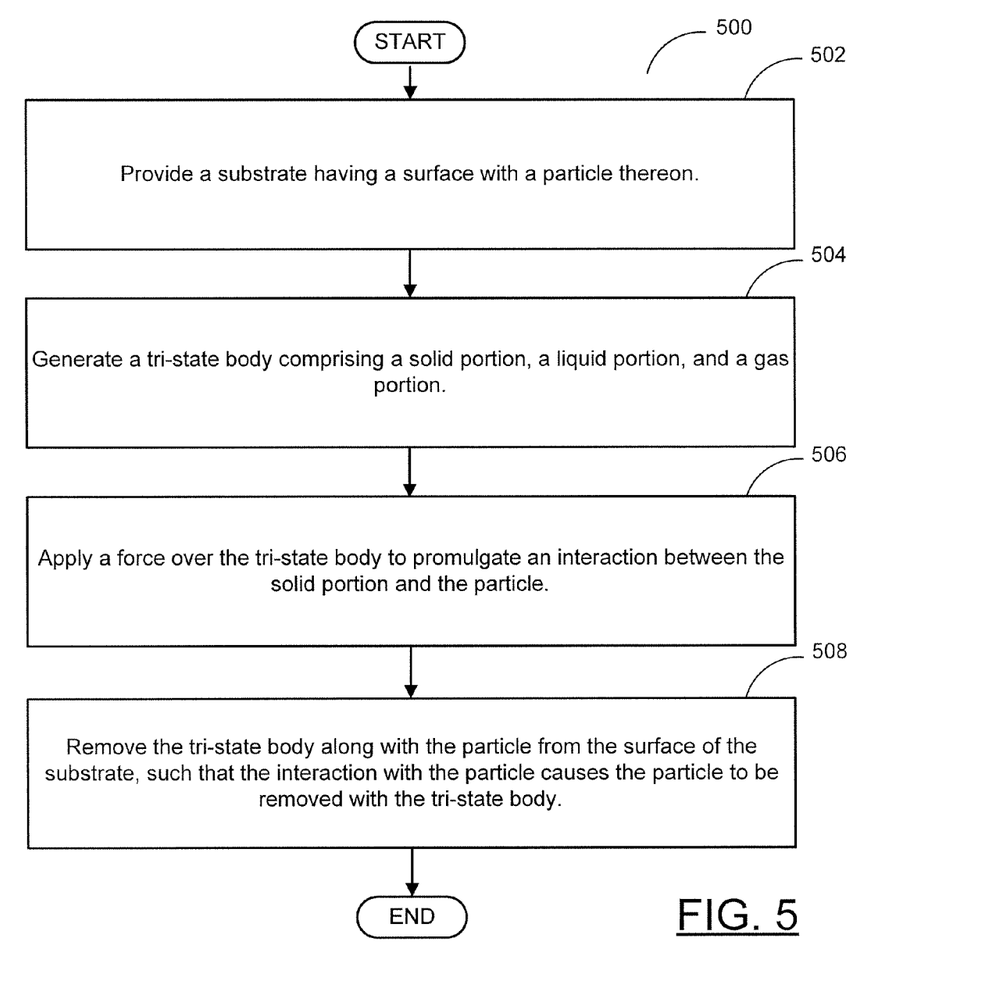
FIG. 5 is a flow chart of a method for using a tri-state body to clean the surface of a substrate, in accordance with one embodiment of the present invention.

FIG. 5 is a flow chart of a method for using a tri-state body to clean the surface of a substrate, in accordance with one embodiment of the present invention. Diagrams of the tri-state body and how they are utilized in this method are shown in FIGS. 1, 2, and 4. Method 500 begins with operation 502 where a substrate with a particle deposited thereon the surface is provided. As discussed previously, the substrate can be either a semiconductor wafer or any contaminated surface. The method 500 moves on to operation 504 where a tri-state body including a solid portion, a liquid portion, and a gas portion is generated. In one embodiment, the tri-state body is generated using a dispensing apparatus that is configured to process (via agitation and/or aeration) the raw material materials supplied to the apparatus into the tri-state body prior to dispensing. In another embodiment, the tri-state body is generated in a reservoir that stores the tri-state body cleaning material prior to being delivered to the dispensing apparatus for dispensing. In still another embodiment, the tri-state body is generated at the point of application through a series of chemical reactions that automatically occur as the tri-state body raw materials are dispensed from the dispensing apparatus.

The method 500 continues on to operation 506 where a force is applied over the tri-state body to promulgate an interaction between the solid portion of the tri-state body and the contaminant particle. As discussed previously, the force can be applied via a pressure or contact force supplied by a fluid or adjacent tri-state bodies that are disposed over the tri-state body towards the surface of the substrate. Alternatively, in one embodiment, the force is applied by an apparatus designed to apply mechanical force against the tri-state body towards the substrate surface.

Continuing with FIG. 5, the method 500 proceeds on to operation 508 where the tri-state body is removed along with the particle from the surface of the substrate such that the interaction between the solid portion of the tri-state body and the contaminant particle causes the particle to be removed along with the tri-state body. As discussed earlier, the interactions between the solid portion of the tri-state body and the contaminant particle can be established through one or more mechanisms including adhesion, collision, attractive forces, and chemical bonding.

Figure 6:
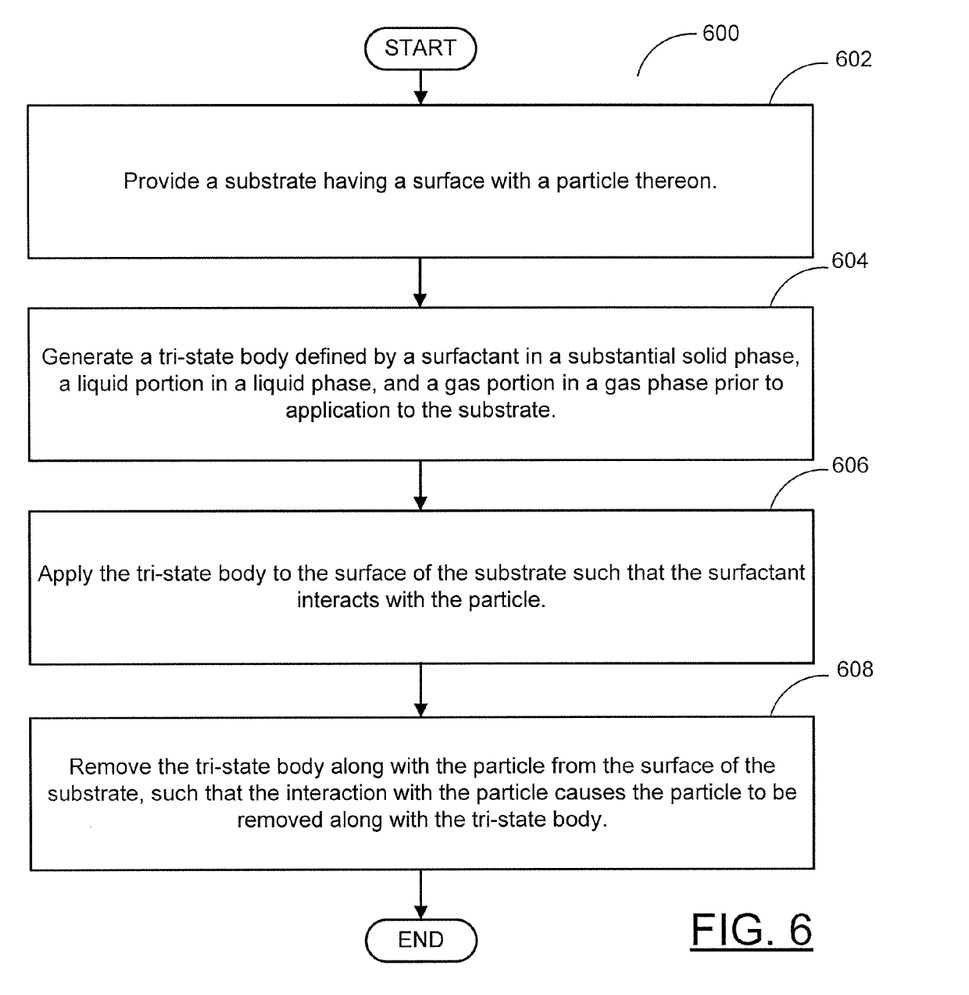
FIG. 6 is a flow chart of a method for using a tri-state body with a surfactant as a solid phase to clean the surface of a substrate, in accordance with one embodiment of the present invention.

FIG. 6 is a flow chart of a method for using a tri-state body with a surfactant as a solid phase to clean the surface of a substrate, in accordance with one embodiment of the present invention. Diagrams of the tri-state body and how they are utilized in this method are shown in FIGS. 1, 2, and 4. Method 600 begins with operation 602 where a substrate with a particle deposited thereon the surface is provided. The method 600 continues on to operation 604 where a tri-state body defined by a surfactant in a substantial solid phase, a liquid portion in a liquid phase, and a gas portion in a gas phase is generated. In one embodiment, the tri-state body is applied using a dispensing applicator that generates and dispenses the tri-state bodies onto the surface of the wafer. In another embodiment, the tri-state body is generated in a reservoir prior to dispensing by the dispensing applicator. In still another embodiment, the tri-state body is generated at the point of application through a series of chemical reactions that automatically occur as the tri-state body raw materials are dispensed from the dispensing apparatus.

In one embodiment, the surfactant is distributed throughout the liquid portion 106 to define a plurality of hydrocarbon chains having a carboxyl group attached to one end of each of the plurality of hydrocarbon chains the are in suspension. The plurality of hydrocarbon chains being adverse to flocculation. In one embodiment, the dispersion of the surfactant is activated through the application of a base to the tri-state body.

Still with FIG. 6, the method 600 then proceeds on to operation 606 where the tri-state body is applied to the surface of the substrate such that the surfactant interacts with the particle on the wafer surface. In one embodiment, a force is applied to the tri-state body, thus moving the surfactant so that it is proximate to or contacting the particle. The force is applied via a pressure supplied by a fluid or adjacent tri-state bodies that are disposed over the tri-state body towards the surface of the substrate. In another embodiment, the force is applied by an apparatus designed to apply mechanical force against the tri-state body towards the substrate surface.

The method 600 then moves on to operation 608 where the tri-state body is removed along with the particle from the surface of the substrate such that the interaction between the surfactant and the particle causes the particle to be removed along with the tri-state body. The interactions between the surfactant and the contaminant particle can be established through one or more mechanisms including adhesion, collision, attractive forces, and chemical bonding.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A cleaning material for preparing a substrate, the cleaning material comprising:
   a liquid component;
   a solid component defined by a plurality of solids that are dispersed within the liquid component, the solid component defining a plurality of hydrocarbon chains having a carboxyl group attached to one end of each of the plurality of hydrocarbon chains that are in suspension and are adverse to flocculation among the plurality of hydrocarbon chains; and
   a gas component intermixed with the liquid component and the solid component, to define the cleaning material in a state to be applied to the substrate.

2. The cleaning material for preparing a substrate, as recited in claim 1, wherein the liquid component includes a base.

3. The cleaning material for preparing a substrate, as recited in claim 2, wherein the base is an aqueous base selected from the group consisting of ammonia hydroxide, potassium hydroxide, sodium hydroxide, and tetramethylammonium hydroxide.

4. The cleaning material for preparing a substrate, as recited in claim 1, wherein the solids act as a foam inhibitor.

5. The cleaning material for preparing a substrate, as recited in claim 1, wherein the solid component acts as a surfactant.

6. The cleaning material for preparing a substrate, as recited in claim 1, wherein the solid component is ionized by the liquid component to form the plurality of solids.

7. The cleaning material for preparing a substrate, as recited in claim 1, wherein the solid component has a carboxylic, sulfonic, or phosphonic acid portion.

8. A substrate cleaning solution, comprising:
   a plurality of hydrocarbon chains, each of the plurality hydrocarbon chains having a carboxyl group, the plurality of hydrocarbon chains forming a solid component dispersed and in suspension within a liquid component; and
   a gas component intermixed with the liquid component and the solid component, wherein the liquid component and the gas component define an encapsulating transport, the gas component further substantially filling the encapsulating transport, the encapsulating transport is combined with other encapsulating transports to define the substrate cleaning solution to be applied to a substrate.

9. The substrate cleaning solution, as recited in claim 8, wherein the solid component interacts with a particle on a surface of the substrate, the interaction is one of a connection or transfer of momentum between the particle and the solid component.

10. The substrate cleaning solution, as recited in claim 9, wherein if the interaction is the connection, the connection is one of adhesion or repulsion.

11. The substrate cleaning solution, as recited in claim 8, wherein the encapsulating transports apply a force that causes the solid component to come in proximity to a particle so as to facilitate the interaction with the solid component and the particle on the surface of the substrate.

12. The substrate cleaning solution, as recited in claim 8, wherein suspension of the solid component is activated through an application of a base to the substrate cleaning solution.

13. The substrate cleaning solution, as recited in claim 8, wherein the gas component is one of a gas mixture of, ozone ($O_3$), oxygen ($O_2$), hydrochloric acid (HCl), hydrofluoric acid (HF), nitrogen ($N_2$), and argon (Ar);
   ozone ($O_3$) and nitrogen ($N_2$);
   ozone ($O_3$) and argon (Ar);
   ozone ($O_3$), oxygen ($O_2$) and nitrogen ($N_2$);
   ozone ($O_3$), oxygen ($O_2$) and argon (Ar);
   ozone ($O_3$), oxygen ($O_2$), nitrogen ($N_2$), and argon (Ar); and
   oxygen ($O_2$), argon (Ar) and nitrogen ($N_2$).

14. The substrate cleaning solution, as recited in claim 8, wherein the solid component acts as a foam inhibitor.

15. A foam for cleaning a substrate, comprising:
   a plurality of tri-state bodies, the tri-state bodies having a diameter smaller than a largest dimension of a particle on the substrate, each tri-state body including,
   a liquid portion,
   a solid portion defined by a surfactant in a substantial solid phase, the surfactant distributed in the liquid portion to define a plurality of hydrocarbon chains having a carboxyl group attached to one end of each of the plurality of hydrocarbon chains; and
   a gas portion, wherein the liquid portion, the solid portion and the gas portion define the plurality of tri-state bodies.

16. The foam for cleaning a substrate, as recited in claim 15, wherein the liquid component includes a base.

17. The foam for cleaning a substrate, as recited in claim 16, wherein the base is an aqueous base selected from the group consisting of ammonia hydroxide, potassium hydroxide, sodium hydroxide, and tetramethylammonium hydroxide.

18. The foam for cleaning a substrate, as recited in claim 15, wherein adjacent tri-state bodies positioned over the tri-state body applies a force to promulgate an interaction between the solid portion and a particle on the substrate.

* * * * *